United States Patent
Jeong et al.

(10) Patent No.: US 7,742,349 B2
(45) Date of Patent: Jun. 22, 2010

(54) SEMICONDUCTOR MEMORY DEVICE

(75) Inventors: Chun-Seok Jeong, Kyoungki-do (KR); Beom-Ju Shin, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 161 days.

(21) Appl. No.: 12/164,045

(22) Filed: Jun. 28, 2008

(65) Prior Publication Data

US 2009/0003117 A1    Jan. 1, 2009

(30) Foreign Application Priority Data

Jun. 29, 2007   (KR) .................. 10-2007-0065416
Jun. 3, 2008    (KR) .................. 10-2008-0052318

(51) Int. Cl.
    *G11C 7/00* (2006.01)
(52) U.S. Cl. .............. 365/201; 365/189.12; 365/189.02
(58) Field of Classification Search ................. 365/201, 365/189.12, 189.02
    See application file for complete search history.

(56) References Cited

U.S. PATENT DOCUMENTS 6,898,139 B2 *   5/2005   Lee et al. .................. 365/221

2006/0010292 A1   1/2006   DeVale et al.
2007/0168631 A1   7/2007   Heo

FOREIGN PATENT DOCUMENTS

| JP | 2001-256062      | 9/2001  |
| JP | 2004-362215      | 12/2004 |
| KR | 1020040104903 A  | 12/2004 |
| KR | 100719181 B1     | 5/2007  |
| KR | 100719377 B1     | 5/2007  |

OTHER PUBLICATIONS

Notice of Preliminary Rejection issued from Korean Intellectual Property Office on Aug. 28, 2009 with an English Translation.

* cited by examiner

*Primary Examiner*—Son Dinh
*Assistant Examiner*—Nam Nguyen
(74) *Attorney, Agent, or Firm*—IP & T Law Firm PLC (57) ABSTRACT

A circuit can control a bit rate of information output from a multi-purpose register (MPR) of a semiconductor memory device in a test mode, thereby reducing current consumption for outputting information in a multi-purpose register (MPR). The semiconductor memory device includes a multi-purpose register configured separately to store a plurality of information, and to control a bit rate of the stored information in a test mode, each of the information having multiple bits, and a connection selector configured selectively to connect an output terminal of the multi-purpose register to one of a number of global lines according to an operation mode.

14 Claims, 5 Drawing Sheets

SEMICONDUCTOR MEMORY DEVICE

CROSS-REFERENCE TO RELATED APPLICATIONS

The present invention claims priority of Korean patent application numbers 10-2007-0065416 and 10-2008-0052318, filed respectively on Jun. 29, 2007 and Jun. 3, 2008, which are incorporated by reference in their entirety.

BACKGROUND OF THE INVENTION

The present invention relates to a semiconductor memory device, particularly to a multi-purpose register (MPR) of the semiconductor memory device which is a circuit that can control bit rate of information output from the MPR and reduce current consumption for outputting the information from the MPR.

In a system with a variety of semiconductor devices, a semiconductor memory device serves as a data storage. The semiconductor memory device outputs data corresponding to addresses received from a data processor, e.g., a central processing unit (CPU), or stores data received from the data processor into memory cells selected by addresses.

As the operating speed of the system increases and semiconductor integrated circuit technologies become more advanced, semiconductor memory devices are required to input and output data at higher speed. In order to obtain faster and stable operations, semiconductor memory devices include a variety of circuits for additional operations such as sensing internal temperature, in addition to a core region and a peripheral region for performing data input/output operation.

Consequently, the semiconductor memory devices are required to have the MPR in order to store information for these additional operations.

Figure 1:
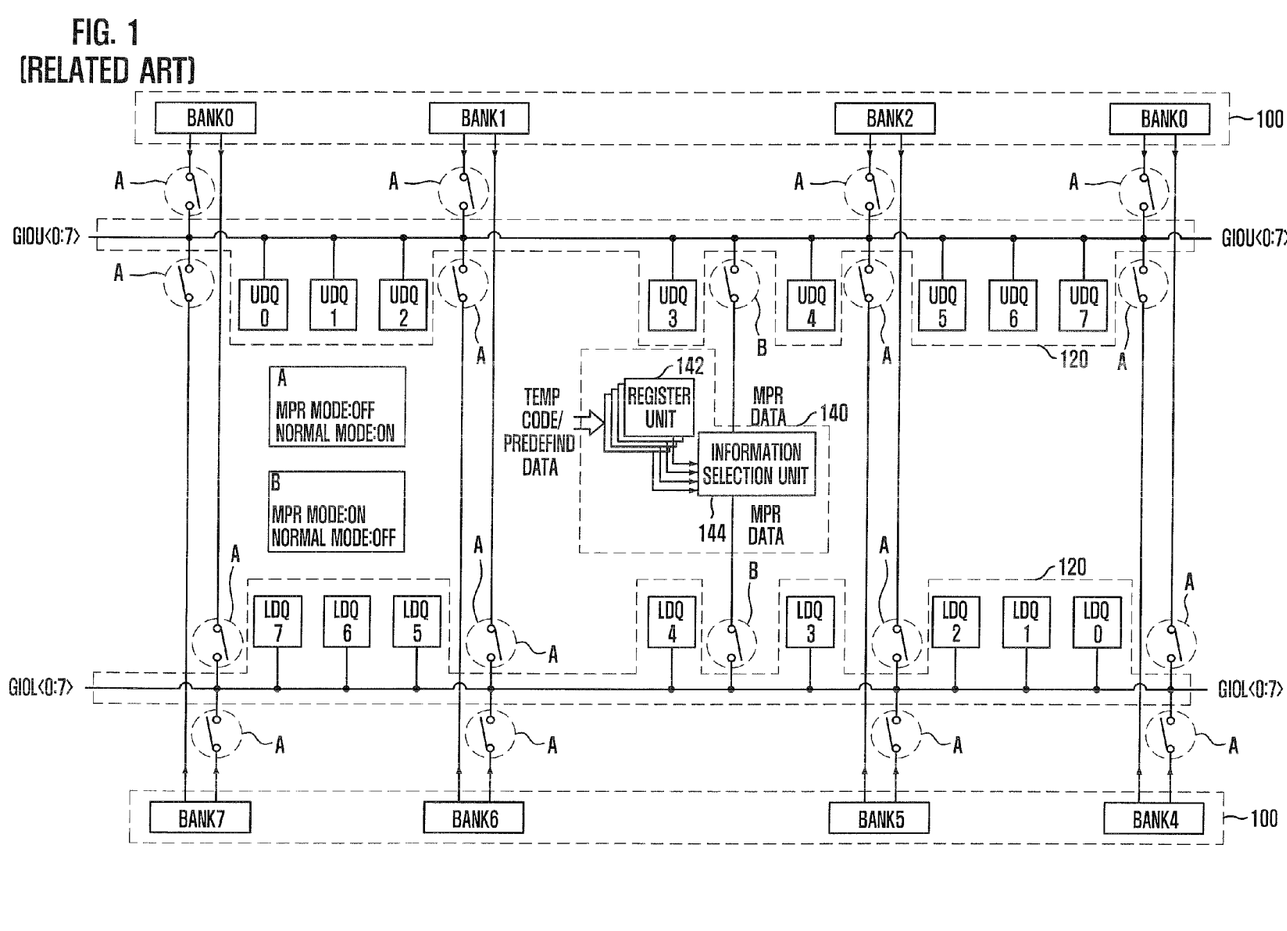
FIG. 1 is a block diagram for illustrating a multi-purpose register in a conventional semiconductor memory device.

FIG. 1 is a block diagram for illustrating the MPR 140 in the conventional semiconductor memory device.

Referring to FIG. 1, the MPR 140 may be connected to a data output path 120 including a plurality of data output pads DQ, according to an operation mode.

Specifically, in a normal mode NORMAL_MODE, the core region 100 is connected to the data output path 120 to output data stored in the core region 100 from the semiconductor memory device. In this case, because the MPR 140 is not connected to the data output path 120, information in the MPR 140 are not output from the semiconductor memory device.

In an information output mode MPR_MODE, the MPR 140 is connected to the data output path 120 to output the information in the MPR 140 from the semiconductor memory device. In this case, since the core region 100 is not connected to the data output path 120, the data in the core region 100 are not output from the semiconductor memory device.

That is, in the normal mode NORMAL_MODE, where basic operations such as data input/output operations of the semiconductor memory device are performed, the MPR 140 stores a series of information. However, in the information output mode MPR_MODE, the MPR 140 outputs the information from the semiconductor memory device.

TABLE 1

| MR3 A[2] | MR3 A[1:0] | Function | Burst Length | Read Address A[2:0] | Burst Order and Data Pattern |
|---|---|---|---|---|---|
| 1 | 00b | Read Predefined Pattern for System Calibration | BL = 8 | 000b | Burst Order 0, 1, 2, 3, 4, 5, 6, 7 Predefined pattern [0, 1, 0, 1, 0, 1, 0, 1] |
| 1 | 00b | | BC4 | 000b | Burst Order 0, 1, 2, 3 Pre-defined pattern [0, 1, 0, 1] |
| 1 | 00b | | BC4 | 100b | Burst Order 4, 5, 6, 7 Pre-defined pattern [0, 1, 0, 1] |
| 1 | 01b | RFU | — | — | |
| 1 | 10b | RFU | — | — | |
| 1 | 11b | Thermal Sensor Readout | | 000b | Burst Order 0, 1, 2, 3, 4, 5, 6, 7 |
| 1 | 11b | | | 000b | Burst Order 0, 1, 2, 3 Burst bit 0 is thermal sensor LSB |
| 1 | 11b | | | 100b | Burst Order 4, 5, 6, 7 Burst bit 7 is thermal sensor MSB (sign bit) |

Table 1 shows the Joint Electron Device Engineering Council (JEDEC) specification for the MPR 140.

As shown in Table 1, the MPR 140 stores predefined information and temperature information. The predefined information (Read Predefined Pattern For System Calibration) is set to a predetermined value as a reference of an operation of the semiconductor. The temperature information (Thermal Sensor Readout) indicates internal temperature of the semiconductor memory device, which is output from an on die thermal sensor (ODTS).

To this end, the MPR 140 includes a plurality of register units 142 and an information selection unit 144. The plurality of register units 142 are configured to store a plurality of information, respectively, each of the information having multiple bits. The information selection unit 144 is configured to output information stored in one of the plurality of register units 142.

As shown in Table 1, which information is to be output from the MPR 140 is determined by a selection information A[0:2] defined in a memory register set (MRS).

Specifically, an uppermost bit A[2] of the selection information A[0:2] defined in the MRS is used to determine whether to enter the information output mode MPR_MODE or not. That is, when the uppermost bit A[2] of the selection information A[0:2] has a logic high level, the semiconductor memory device enters the information output mode MPR_MODE. When the uppermost bit A[2] of the selection information A[0:2] has a logic low level, the semiconductor memory device exits the information output mode MPR_MODE.

The bits A[0:1] of the selection information A[0:2] defined in the MRS are used to select one of the information stored in the MPR 140 in the information output mode MPR_MODE.

That is, when the bits A[0:1] of the selection information A[0:2] are all have a logic high level, the predefined information (Read Predefined Pattern For System Calibration) is selected. On the contrary, when the bits A[0:1] of the selection information A[0:2] are all have a logic low level, the temperature information (Thermal Sensor Readout) is selected.

In a case where one of the bits A[0:1] has a logic high level and the other has a logic low level, i.e., the bits A[0:1] have different logic levels, information RFU is selected, which can be arbitrarily stored by a user.

In the conventional semiconductor memory device, not only the data in the core region 100, but also the information in the MPR 140 should be output from the semiconductor memory device through the data output path 120. The data output path 120 refers to an internal element of the semiconductor memory device for transferring the data which will be output from the semiconductor memory device. The data output path 120 includes global lines GIOU<0:7> and GIOL<0:7> and data output pads UDQ<0:7> and LDQ<0:7> in FIG. 1.

The data path 120 for the data in the core region 100 is the same element as that for the information in the MPR 140. However, the operation of the data path 120 for the data in the core region 100 is different from the operation of the data path 120 for the information in the MPR 140, which will be described in detail below.

Regarding the data path 120 for the data in the core region 100, the data in the core region 100 are output from the semiconductor memory device through all of the data output pads UDQ<0:7> and LDQ<0:7>. This is because the data in the core region 100 are transferred through the global lines GIOU<0:7> and GIOL<0:7> at the same time.

Regarding the data path 120 for the information in the MPR 140, the information in the MPR 140 are output from the semiconductor memory device only through the data output pads UDQ<0> and LDQ<0>. This is because the information in the MPR 140 are transferred only through the global lines GIOU<0> and GIOL<0>, not through the other global lines GIOU<1:7> and GIOL<1:7>.

In other words, all of the elements of the data path 120 are used for transferring the data in the core region 100. However, only a few elements of the data path 120 are used for transferring the information in the MPR 140. More specifically, for transferring the information in the MPR 140, only the zeroth upper global line GIOU<0>, the zeroth lower global line GIOL<0>, the zeroth upper data output pad UDQ<0> and the zeroth lower data output pad LDQ<0> are used. That is, the other elements including the first to seventh upper global lines GIOU<1:7>, the first to seventh lower global lines GIOL<1:7>, the first to seventh upper data output pads UDQ<1:7> and the first to seventh lower data output pads LDQ<1:7> are not used.

Figure 2:
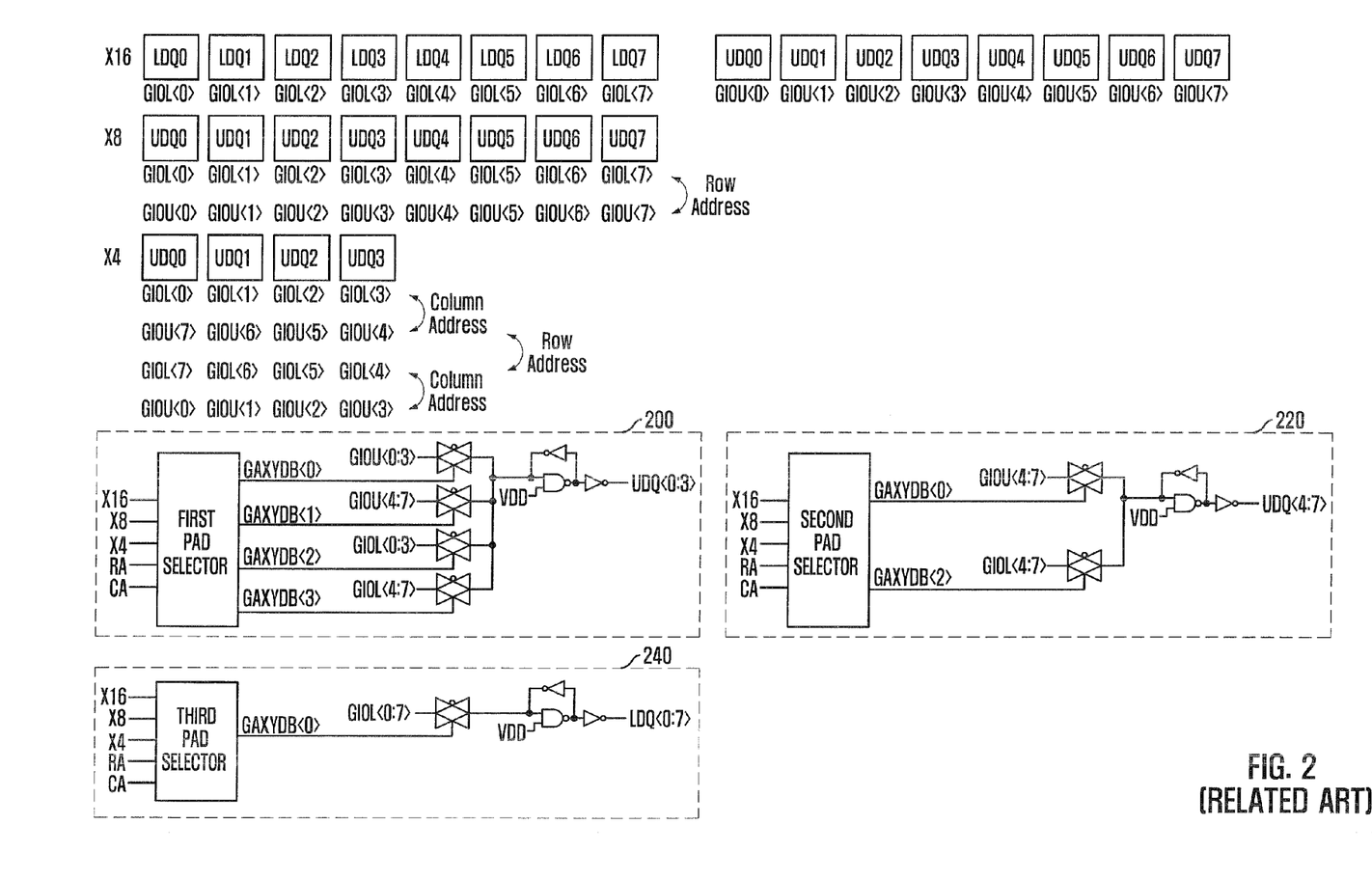
FIG. 2 is a block diagram for illustrating a path for transferring information in a multi-purpose register when connection relations of global lines and data output pads are varied according to variations of a data output bandwidth in a conventional semiconductor memory device.

FIG. 2 is a block diagram for illustrating a path for transferring the information in the MPR 140 when connection relations of the global lines and the data output pads are varied according to variations of a data output bandwidth in a conventional semiconductor memory device.

Referring to FIG. 2, as the data output bandwidth is varied to ×16, ×8 and ×4, the connection relations of the global lines GIOU<0:7> and GIOL<0:7> and the data output pads UDQ<0:7> and LDQ<0:7> in the conventional semiconductor memory device are varied.

Specifically, when the data output bandwidth of the semiconductor memory device is ×16, the global lines GIOU<0:7> and GIOL<0:7> are one-to-one connected to the data output pads UDQ<0:7> and LDQ<0:7>.

In more detail, the zeroth upper global line GIOU<0> is connected to the zeroth upper data output pad UDQ<0>. The first upper global line GIOU<1> is connected to the first upper data output pad UDQ<1>. The second upper global line GIOU<1> is connected to the second upper data output pad UDQ<2>. The third upper global line GIOU<3> is connected to the third upper data output pad UDQ<3>. The fourth upper global line GIOU<4> is connected to the fourth upper data output pad UDQ<4>. The fifth upper global line GIOU<5> is connected to the fifth upper data output pad UDQ<5>. The sixth upper global line GIOU<6> is connected to the sixth upper data output pad UDQ<6>. The seventh upper global line GIOU<7> is connected to the seventh upper data output pad UDQ<7>. Similarly, the zeroth lower global line GIOL<0> is connected to the zeroth lower data output pad LDQ<0>. The first lower global line GIOL<1> is connected to the first lower data output pad LDQ<1>. The second lower global line GIOL<2> is connected to the second lower data output pad LDQ<2>. The third lower global line GIOL<3> is connected to the third lower data output pad LDQ<3>. The fourth lower global line GIOL<4> is connected to the fourth lower data output pad LDQ<4>. The fifth lower global line GIOL<5> is connected to the fifth lower data output pad LDQ<5>. The sixth lower global line GIOL<6> is connected to the sixth lower data output pad LDQ<6>. The seventh lower global line GIOL<7> is connected to the seventh lower data output pad LDQ<7>.

In this case, in the normal mode NORMAL_MODE, data in the core region 100 are loaded on all of the global lines GIOU<0:7> and GIOL<0:7>, and the global lines GIOU<0:7> and GIOL<0:7> are directly connected to the data output pads UDQ<0:7> and LDQ<0:7>, respectively. Therefore, the data in the core region 100 are output through the respective data output pads UDQ<0:7> and LDQ<0:7>.

To this end, a first pad selector 200, a second pad selector 220 and a third pad selector 240 are all enabled. Here, the first pad selector 200 is configured to control connections of all of the global lines GIOU<0:3>, GIOU<4:7>, GIOL<0:3> and GIOL<4:7> to the top upper data output pads UDQ<0:3> according to the data output bandwidth. The second pad selector 220 is configured to control connections of the bottom upper global lines GIOU<4:7> and the bottom lower global lines GIOL<4:7> to the bottom upper data output pads UDQ<4:7> according to the data output bandwidth. The third pad selector 240 is configured to control the connections of the lower global lines GIOL<0:7> to the lower data output pads LDQ<0:7> according to the data output bandwidth.

The global lines GIOU<0:7> and GIOL<0:7> are directly connected to the data output pads UDQ<0:7> and LDQ<0:7>, respectively, as described above. However, the information in the MPR 140 used in the information output mode MPR_MODE are loaded only on the zeroth upper global line GIOU<0> and the zeroth lower global line GIOL<0>. Therefore, the information in the MPR 140 are output only through the zeroth upper data output pad UDQ<0> and the zeroth lower data output pad LDQ<0>.

When the data output bandwidth of the semiconductor memory device is ×8, the global lines GIOU<0:7> and GIOL<0:7> are connected to the upper data output pads UDQ<0:7> in two-to-one correspondence.

In other words, the zeroth to seventh lower data output pads LDQ<0:7> are not used. Hence, the zeroth upper global line GIOU<0> and the zeroth lower global line GIOL<0> are connected to the zeroth upper data output pad UDQ<0>. The first upper global line GIOU<1> and the first lower global line GIOL<1> are connected to the first upper data output pad UDQ<1>. The second upper global line GIOU<2> and the second lower global line GIOL<2> are connected to the second upper data output pad UDQ<2>. The third upper global line GIOU<3> and the third lower global line GIOL<3> are connected to the third upper data output pad UDQ<3>. The fourth upper global line GIOU<4> and the fourth lower global line GIOL<4> are connected to the fourth upper data output pad UDQ<4>. The fifth upper global line GIOU<5> and the fifth lower global line GIOL<5> are connected to the fifth upper data output pad UDQ<5>. The sixth upper global line GIOU<6> and the sixth lower global line GIOL<6> are connected to the sixth upper data output pad UDQ<6>. Finally, the seventh upper global line GIOU<7> and the seventh lower global line GIOL<7> are connected to the seventh upper data output pad UDQ<7>.

In this case, in the normal mode NORMAL_MODE, the data in the core region 100 are loaded on all of the global lines including the upper global lines GIOU<0:7> and the lower global lines GIOL<0:7>, as described above. The global lines GIOU<0:7> and GIOL<0:7> are divided to the upper global lines GIOU<0:7> and the lower global lines GIOL<0:7>, and not only the upper global lines GIOU<0:7>, but also the lower global lines GIOL<0:7> are connected to the upper data output pads UDQ<0:7>. Therefore, the data in the core region 100 are output through the upper data output pads UDQ<0:7>.

To this end, the first pad selector 200 is enabled, which is configured to control the connections of all of the global lines GIOU<0:3>, GIOU<4:7>, GIOL<0:3> and GIOL<4:7> to the top upper data output pads UDQ<0:3> according to the data output bandwidth. Also, the second pad selector 220 is enabled, which is configured to control the connections of the bottom upper global lines GIOU<4:7> and the bottom lower global lines GIOL<4:7> to the bottom upper data output pads UDQ<4:7> according to the data output bandwidth. However, the third pad selector 240 is disabled, which is configured to control the connections of the lower global lines GIOL<0:7> to the lower data output pads LDQ<0:7> according to the data output bandwidth.

As described above, the global lines GIOU<0:7> and GIOL<0:7> are divided to the upper global lines GIOU<0:7> and the lower global lines GIOL<0:7>, and not only the upper global lines GIOU<0:7>, but also the lower global lines GIOL<0:7> are connected to the upper data output pads UDQ<0:7>. However, the information in the MPR 140, which are used in the information output mode MPR_MODE, are loaded only on the zeroth upper global line GIOU<0> and the zeroth lower global line GIOL<0>. Therefore, the information in the MPR 140 are output only through the zeroth upper data output pad UDQ<0>.

In order to determine whether the data output through the zeroth upper data output pad UDQ<0> is the data loaded on the zeroth upper global line GIOU<0> or the data loaded on the zeroth lower global line GIOL<0>, a not-used bit of the row address (RA) is utilized.

When the data output bandwidth of the semiconductor memory device is ×4, the global lines GIOU<0:7> and GIOL<0:7> are connected to the zeroth to third upper data output pads UDQ<0:3> in four-to-one correspondence.

In other words, the fourth to seventh upper data output pads UDQ<4:7> and the zeroth to seventh lower data output pads LDQ<0:7> are not used. Hence, the zeroth and seventh upper global lines GIOU<0> and GIOU<7> and the zeroth and seventh lower global lines GIOL<0> and GIOL<7> are connected to the zeroth upper data output pad UDQ<0>. The first and sixth upper global lines GIOU<1> and GIOU<6> and the first and sixth lower global lines GIOL<1> and GIOL<6> are connected to the first upper data output pad UDQ<1>. The second and fifth upper global lines GIOU<2> and GIOU<5> and the second and fifth lower global lines GIOL<2> and GIOL<5> are connected to the second upper data output pad UDQ<2>. The third and fourth upper global lines GIOU<3> and GIOU<4> and the third and fourth lower global lines GIOL<3> and GIOL<4> are connected to the third upper data output pad UDQ<3>.

In this case, only the top upper data output pads UDQ<0:3> are used, and the bottom upper data output pads UDQ<4:7>, the top lower data output pads LDQ<0:3> and the bottom lower data output pads LDQ<4:7> are not used. Thus, in the normal mode NORMAL_MODE, the data in the core region 100 are loaded on all of the global lines GIOU<0:7> and GIOL<0:7>. The global lines are divided to the top upper global lines GIOU<0:3>, bottom upper global lines GIOU<4:7>, top lower global lines GIOL<0:3> and bottom lower global lines GIOL<4:7>. Here, not only the top upper global lines GIOU<0:3>, but also the bottom upper global lines GIOU<4:7>, the top lower global lines GIOL<0:3> and the bottom lower global lines GIOL<4:7> are connected to the top upper data output pads UDQ<0:3>. Therefore, the data in the core region 100 are output through the top upper data output pads UDQ<0:3>.

To this end, the first pad selector 200 is enabled, which is configured to control the connections of all of the global lines GIOU<0:3>, GIOU<4:7>, GIOL<0:3> and GIOL<4:7> to the top upper data output pads UDQ<0:3> according to the data output bandwidth. However, the second pad selector 220 is disabled, which is configured to control the connections of the bottom upper global lines GIOU<4:7> and the bottom lower global lines GIOL<4:7> to the bottom upper data output pads UDQ<4:7> according to the data output bandwidth. In addition, the third pad selector 240 is also disabled, which is configured to control the connections of the lower global lines GIOL<0:7> to the lower data output pads LDQ<0:7> according to the data output bandwidth.

As described above, the global lines GIOU<0:7> and GIOL<0:7> are divided to the top upper global lines GIOU<0:3>, the bottom upper global lines GIOU<4:7>, the top lower global lines GIOL<0:3> and the bottom lower global lines GIOL<4:7>. Here, not only the top upper global lines GIOU<0:3>, but also the bottom upper global lines GIOU<4:7>, the top lower global lines GIOL<0:3> and the bottom lower global lines GIOL<4:7> are connected to the top upper data output pads UDQ<0:3>. However, the information in the MPR 140, which are used in the information output mode MPR_MODE, are loaded only on the zeroth upper global line GIOU<0> and the zeroth lower global line GIOL<0>. Therefore, the information in the MPR 140 are output only through the zeroth upper data output pad UDQ<0>.

In order to determine whether the data output through the top upper data output pads UDQ<0:3> are the data loaded on the upper global lines GIOU<0:7> or the data loaded on the lower global lines GIOL<0:7>, a not-used bit of the row address (RA) is utilized. Furthermore, in order to determine whether the data output through the top upper data output pads UDQ<0:3> are the data loaded on the top global lines GIOU<0:3> and GIOL<0:3> or the data loaded on the bottom global lines GIOU<4:7> and GIOL<4:7>, a not-used bit of the column address (CA) is utilized.

The first to third pad selectors 200, 220 and 240 having the above described configurations allow the data loaded in the global lines GIOU<0:7> and GIOL<0:7> to be appropriately output from the semiconductor memory device, even if the connection relations of the global lines GIOU<0:7> and GIOL<0:7> and the data output pads UDQ<0:7> and GIOL<0:7> are varied according to the data output bandwidth.

The design of the first to third pad selectors 200, 220 and 240 is centered on appropriate outputting of the data in the core region 100. Accordingly, when the information in the MPR 140 are output only through the predetermined global lines GIOU<0> and GIOL<0>, data loaded on the other global lines GIOU<1:7> and GIOL<1:7> are output regardless of what the data are, and ignored because they are meaningless data.

However, the outputting of the meaningless data also consumes current. This means that the semiconductor memory device utilizing the first to third pad selectors 200, 220 and 240 having the above described configurations consumes unnecessary current in the information output mode MPR_MODE.

TABLE 2

| RA | CA | GAXDB<0> | GAXDB<1> | GAXDB<2> | GAXDB<3> |
|---|---|---|---|---|---|
| X16 | X | X | L | L | H | L |
| X8 | L | X | H | L | L | L |
| X8 | H | X | L | L | H | L |
| X4 | L | L | H | L | L | L |
| X4 | L | H | L | H | L | L |
| X4 | H | L | L | L | H | L |
| X4 | H | H | L | L | L | H |

Logic level relations among signals for controlling the first pad selector 200, the second pad selector 220 and the third pad selector 240 are shown in Table 2. Here, as described above, the first pad selector 200 controls the connections of all the global lines GIOU<0:3>, GIOU<4:7>, GIOL<0:3> and GIOL<4:7> to the top lower data output pads LDQ<0:3> according to the data output bandwidth. Also, the second pad selector 220 controls the connections of the bottom upper global lines GIOU<4:7> and the bottom lower global lines GIOL<4:7> to the bottom lower data output pads LDQ<4:7> according to the data output bandwidth, and the third pad selector 240 controls the connections of the lower global lines GIOL<0:7> to the upper data output pads LDQ<0:7> according to the data output bandwidth.

As described above, the MPR 140 of the conventional semiconductor memory device can output the information from the semiconductor memory device through the predetermined data output pads UDQ<0> and LDQ<0> in the information output mode.

Here, since the information are also serial binary data, they should be output from the semiconductor memory device in synchronization with an external clock, like the data in the core region 100.

For example, the MPR 140 used in a double data rate (DDR) semiconductor memory device, which outputs data twice in one cycle of an external clock, should output two bits of the information in one cycle of the external clock through the predetermined data output pads UDQ<0> and LDQ<0>.

Similarly, the MPR 140 used in a double data rate 2 (DDR2) semiconductor memory device, which outputs data four times in one cycle of the external clock, should output four bits of the information in one cycle of the external clock through the predetermined data output pads UDQ<0> and LDQ<0>.

In a case where the semiconductor memory device is installed in a system, such as a personal computer, a server and a notebook computer, there won't be any disruptions in outputting the information in the MPR 140 at a speed corresponding to the operating speed of the semiconductor memory device.

However, when testing the performance of the MPR 140 during the manufacturing of the semiconductor memory device, the outputting of the information in the MPR 140 at the speed corresponding to the operating speed of the semiconductor memory device may cause errors in the test equipment.

As the semiconductor memory device is developed and improved rapidly, the operating speed of the semiconductor memory device is also increased rapidly. Thus, the test equipment for the semiconductor memory device hardly meets the rapidly increasing operating speed of the semiconductor memory device. Therefore, the difference in the operating speeds of the semiconductor memory device and the test equipment thereof may cause test errors while testing the semiconductor memory device during the manufacturing process.

This may be far more serious in the test for outputting the information in the MPR 140, where a test direction may be varied due to the meaningful information, than in the test for outputting the data in the core region 100, where meaningless data may be input/output.

SUMMARY OF THE INVENTION

Embodiments of the present invention are directed to providing a circuit that can control a bit rate of information output from a multi-purpose register (MPR) of a semiconductor memory device in a test mode.

Embodiments of the present invention are also directed to providing a circuit that can reduce current consumption for outputting information in a multi-purpose register (MPR).

In accordance with an aspect of the present invention, there is provided a semiconductor memory device, which includes a multi-purpose register configured to separately store a plurality of information, and reduce a bit rate of the stored information in a test mode, each of the information having multiple bits, and a connection selector configured to selectively connect an output terminal of the multi-purpose register to a plurality of global lines according to an operation mode.

DESCRIPTION OF SPECIFIC EMBODIMENTS

Hereinafter, a semiconductor memory device in accordance with the present invention will be described in detail with reference to the accompanying drawings.

Figure 3:
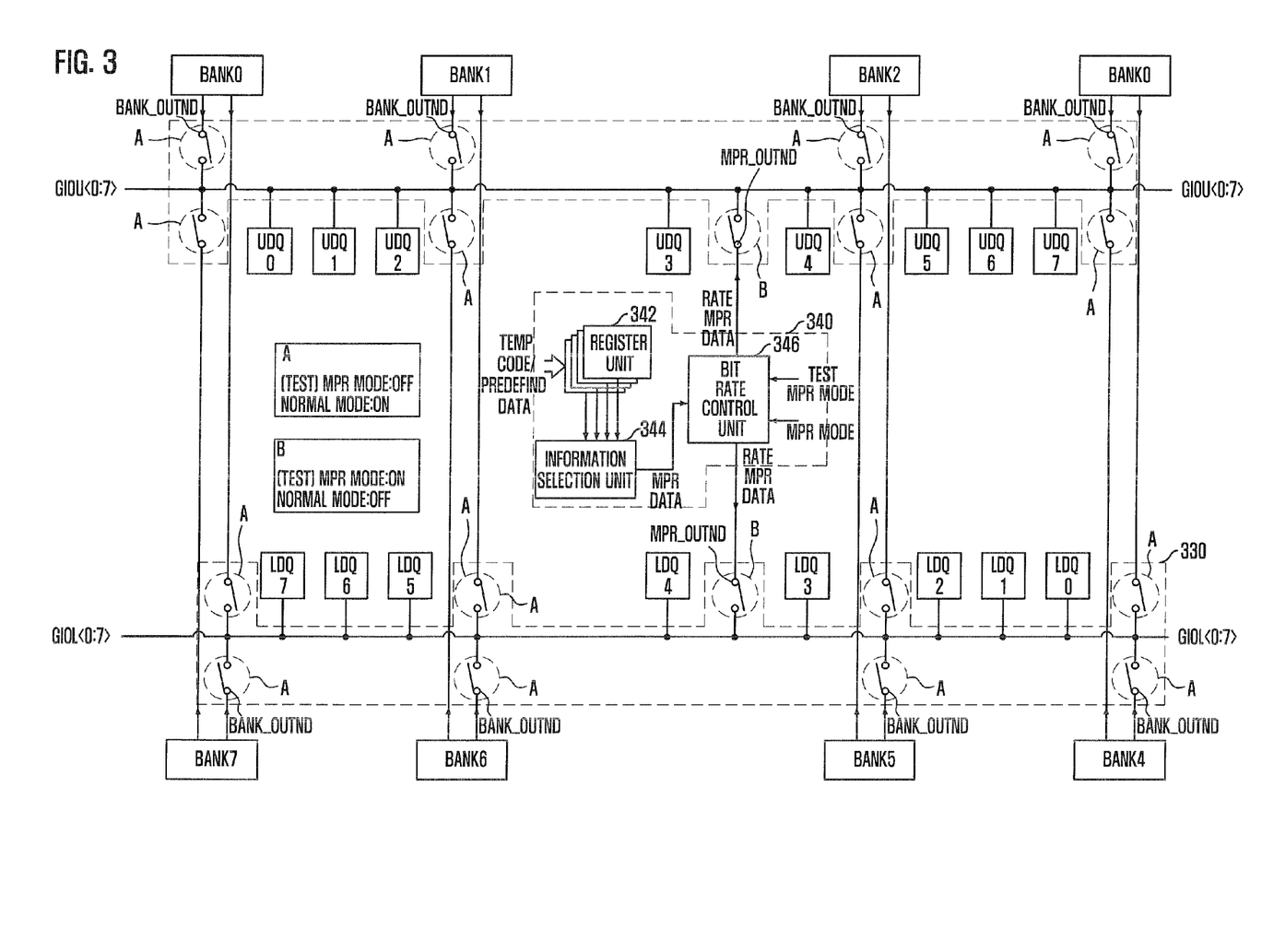
FIG. 3 is a block diagram for illustrating a multi-purpose register of a semiconductor memory device in accordance with an embodiment of the present invention.

FIG. 3 is a block diagram for illustrating a multi-purpose register in a semiconductor memory device in accordance with an embodiment of the present invention.

Referring to FIG. 3, the semiconductor memory device includes a plurality of banks BANK0, BANK1, BANK2, BANK3, BANK4, BANK5, BANK6 and BANK7, a multi-purpose register (MPR) 340, and a connection selector 330. The MPR 340 stores a plurality of information TEMP_CODE and PREDEFINED_DATA, each of the information having multiple bits, and reduces bit rate of the stored information in a test mode TEST_MPR_MODE. The connection selector 330 selectively connects output terminals MPR_OUTND of the MPR 340 and output terminals BANK_OUTND of the banks BANK0, BANK1, BANK2, BANK3, BANK4, BANK5, BANK6 and BANK7 to a plurality of global lines GIOU<0:7> and GIOL<0:7> according to an operation mode such as a normal mode NORMAL_MODE and an information output mode MPR_MODE.

The MPR 340 includes a plurality of register units 342, an information selection unit 344 and a bit rate control unit 346. The plurality of register units 342 stores the plurality of information TEMP_CODE and PREDEFINED_DATA, each of the information having multiple bits. The information selection unit 344 outputs one of the information as an information MPR_DATA. The bit rate control unit 346 reduces the bit rate of the information MPR_DATA to output a rate-controlled information RATE_MPR_DATA in the test mode TEST_MPR_MODE. The bit rate control unit 346 directly outputs the information MPR_DATA as the rate-controlled information RATE_MPR_DATA without reducing the bit rate thereof in the information output mode MPR_MODE.

For reference, as shown in FIG. 3, the banks BANK0, BANK1, BANK2 and BANK3 may be disposed at an upper side and the banks BANK4, BANK5, BANK6 and BANK7 may be disposed at a lower side. Accordingly, the upper data output pads UDQ<0:7> may be disposed at an upper side and the lower data output pads LDQ<0:7> may be disposed at a lower side.

However, such a configuration should be construed merely as an example for illustration and another configuration may also be possible. For example, it is also possible that the banks BANK0, BANK1, BANK2 and BANK3 and accordingly the upper data output pads UDQ<0:7> are disposed on a right side, and the banks BANK4, BANK5, BANK6 and BANK7 and accordingly the lower data output pads LDQ<0:7> are disposed at a left side.

Hereinafter, an operation of the MPR 340 in the semiconductor memory device in accordance with the embodiment will be described.

The connection selector 330 connects the plurality of global lines GIOU<0:7> and GIOL<0:7> and output terminals BANK_OUTND of the banks BANK0, BANK1, BANK2, BANK3, BANK4, BANK5, BANK6 and BANK7 in the normal mode NORMAL_MODE. The connection selector 330 connects predetermined global lines GIOU<0> and GIOL<0> and output terminals MPR_OUTND of the MPR 340 in the information output mode MPR_MODE.

The MPR 340 may output a variety of internal information TEMP_CODE and PREDEFINED_DATA from the semiconductor memory device when connected to the predetermined global lines GIOU<0> and GIOL<0> by the connection selector 330.

Similarly, the data stored in each of the banks BANK0, BANK1, BANK2, BANK3, BANK4, BANK5, BANK6 and BANK7 may also be output from the semiconductor memory device when the output terminal BANK_OUTND of the bank is connected to the plurality of global lines GIOU<0:7> and GIOL<0:7> by the connection selector 330.

Therefore, the operation of the MPR 340 of the semiconductor memory device in accordance with the embodiment is identical to that of the MPR 140 of the conventional semiconductor memory device in that the MPR 340 stores a variety of information in the normal mode NORMAL_MODE and outputs the stored information from the semiconductor memory device in the information output mode MPR_MODE.

Kinds of the stored information and a method for selecting the information to be output from the MPR 340 of the semiconductor memory device in accordance with the embodiment are also identical to those of the MPR 140 of the conventional semiconductor memory device.

In other words, the MPR 340 also follows the JEDEC specification shown in Table 1. That is, the MPR 340 stores predefined information (Read Predefined Pattern For System Calibration) and temperature information (Thermal Sensor Readout). In addition, the MPR 340 selects one of the stored information according to the selection information A[0:2] defined in a memory register set (MRS).

However, unlike the MPR 140 in FIG. 1, the MPR 340 further includes the bit rate control unit 346. Configurations of the bit rate control unit 346 will be described in detail below with reference to FIG. 4.

Figure 4:
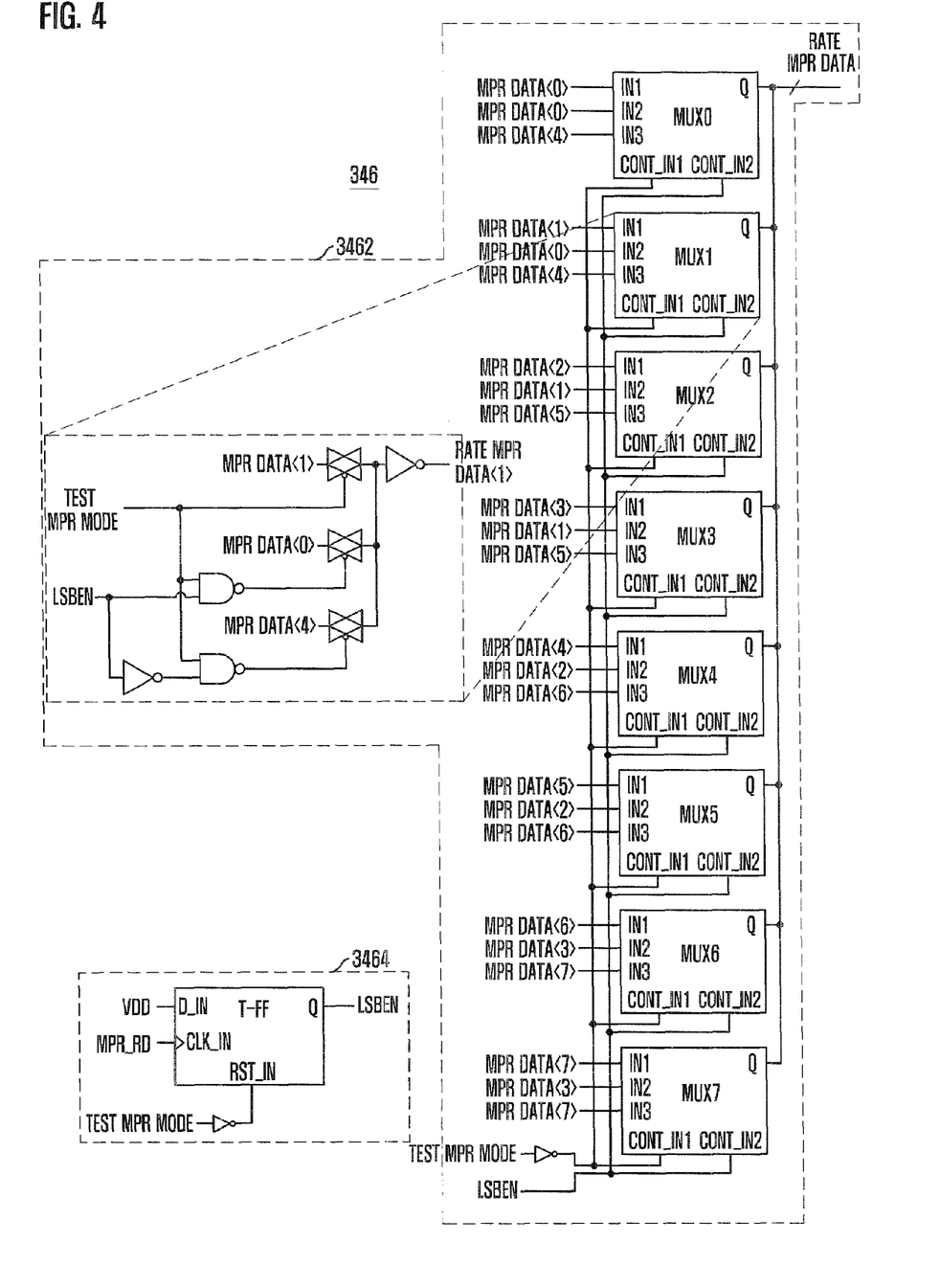
FIG. 4 is a circuit diagram of a bit rate control unit in the multi-purpose register of FIG. 3.

FIG. 4 is a circuit diagram of the bit rate control unit 346 in the MPR 340 of FIG. 3.

Referring to FIG. 4, the bit rate control unit 346 includes a bit output control unit 3462 and an operation control unit 3464. The bit output control unit 3462 continuously and repeatedly outputs each bit of the information MPR_DATA received from the information selection unit 344 for a predetermined number of times, as the rate rate-controlled information RATE_MPR_DATA, in the test mode TEST_MPR_MODE. Also, the bit output control unit 3462 outputs each bit of the information MPR_DATA received from the information selection unit 344 without reducing the bit rate thereof, in the information output mode MPR_MODE. The operation control unit 3464 controls the operation of the bit output control unit 3462 in the test mode TEST_MPR_ MODE.

The bit output control unit 3462 includes a plurality of multiplexers MUX0, MUX1, MUX2, MUX3, MUX4, MUX5, MUX6 and MUX7. The number of the multiplexers is identical to the number of the bits of the information MPR_DATA output from the information selection unit 344. In the information output mode MPR_MODE, each of the multiplexers MUX0, MUX1, MUX2, MUX3, MUX4, MUX5, MUX6 and MUX7 outputs data received at a first input terminal IN1. In the test mode TEST_MPR_MODE, each of the multiplexers MUX0, MUX1, MUX2, MUX3, MUX4, MUX5, MUX6 and MUX7 selectively outputs data received at the second input terminal IN2 and the third input terminal IN3 according to an output signal LSBEN of the operation control unit 3464.

The operation control unit 3464 includes a flip-flop T-FF configured to change a logic level of the output signal LSBEN according to a command MPR_RD for outputting the information in the MPR 340, in the test mode TEST_MPR_MODE.

Hereinafter, the operation of the bit rate control unit 346 will be described.

The flip-flop T-FF of the operation control unit 3464 receives a power supply voltage VDD at a data input terminal D_IN, a command signal MPR_RD for outputting the information in the MPR 340 at a clock input terminal CLK_IN, and an inverted signal of a test mode entry signal TEST MPR MODE at a reset input terminal RST_IN.

Then, the operation control unit 3464 is set to an enabled state in the test mode TEST_MPR_MODE, and reset to a disabled state in other modes, i.e., in the information output mode MPR_MODE or in the normal mode NORMAL_MODE.

Also, as the power supply voltage VDD of a logic high level is applied through at the data input terminal D_IN, the operation control unit 3464 varies the logic level of the output signal LSBEN whenever the logic level of the command signal MPR_RD received at the clock input terminal CLK_IN is transited.

For example, let's assume that the output signal LSBEN initially has a logic low level when the operation control unit 3464 is set to an enabled state. Let's also assume that the command signal MPR_RD for outputting the information in the MPR 340 is activated to a logic high level during the period for outputting the information in the MPR 340, and deactivated to a logic low level during the other periods. Then, the output signal LSBEN of the operation control unit 3464 goes to a logic high level at the same timing of the logic level transition of the command signal MPR_RD from a logic low level to a logic high level when the outputting of the information in the MPR 340 is started. Also, the output signal LSBEN of the operation control unit 3463 goes to a logic low level at the same timing of the logic level transition of the command signal MPR_RS from a logic high level to a logic low level when the outputting of the information in the MPR 340 is terminated.

That is, in the test mode TEST_MODE, the logic level of the output signal LSBEN of the operation control unit 3464 is transited at a timing of the logic level transition of the command signal MPR_RD. However, in the information output mode MPR_MODE and the normal mode NORMAL_MODE, the logic level transition of the output signal LSBEN does not occur.

The multiplexers MUX0, MUX1, MUX2, MUX3, MUX4, MUX5, MUX6 and MUX7 of the bit output control unit 3462 receive bits MPR_DATA<0>, MPR_DATA<1>, MPR_DATA<2>, MPR_DATA<3>, MPR_DATA<4>, MPR_DATA<5>, MPR_DATA<6> and MPR_DATA<7> of the information MPR_DATA output from the information selection unit 344 through their first input terminals IN1, respectively. The multiplexers MUX0, MUX1, MUX2, MUX3, MUX4, MUX5, MUX6 and MUX7 of the bit output control unit 3462 receive the upper bits MPR_DATA<0>, MPR_DATA<0>, MPR_DATA<1>, MPR_DATA<1>, MPR_DATA<2>, MPR_DATA<2>, MPR_DATA<3> and MPR_DATA<3> of the information MPR_DATA output from the information selection unit 344 through their second input terminals IN2, respectively. The multiplexers MUX0, MUX1, MUX2, MUX3, MUX4, MUX5, MUX6 and MUX7 of the bit output control unit 3462 receive the lower bits MPR_DATA<4>, MPR_DATA<4>, MPR_DATA<5>, MPR_DATA<5>, MPR_DATA<6>, MPR_DATA<6>, MPR_DATA<7> and MPR_DATA<7> of the information MPR_DATA output from the information selection unit 344 through their third input terminals IN3, respectively. In addition, the multiplexers MUX0, MUX1, MUX2, MUX3, MUX4, MUX5, MUX6 and MUX7 of the bit output control unit 3462 receive the inversion signal of the test mode entry signal TEST MPR MODE through their respective first control input terminals CONT_IN1, and the output signal LSBEN of the operation control unit 3464 through their respective second control input terminals CONT_IN2.

Specifically, when the test mode entry signal TEST MPR MODE is deactivated, the information output mode MPR_MODE is started. In the information output mode MPR_MODE, the multiplexers MUX0, MUX1, MUX2, MUX3, MUX4, MUX5, MUX6 and MUX7 directly output the bits MPR_DATA<0>, MPR_DATA<1>, MPR_DATA<2>, MPR_DATA<3>, MPR_DATA<4>, MPR_DATA<5>, MPR_DATA<6> and MPR_DATA<7> received one-to-one through their first input terminals IN1, respectively, without reducing the bit rates thereof. In this case, because the output signal LSBEN of the operation control unit 3463 received through the second control input terminals CONT_IN2 is meaningless, the data applied to the second input terminals IN2 and the third input terminals are not output and are ignored.

For example, if the information MPR_DATA output from the information selection unit 344 are '0 0 1 0 1 1 1 0', then the rate-controlled information RATE_MPR_DATA output from the bit output control unit 3462 are also '0 0 1 0 1 1 1 0'.

Because the bit output control unit 3462 directly outputs the information MPR_DATA as the rate-controlled information RATE_MPR_DATA without controlling the bit rate thereof, the rate-controlled information RATE_MPR_DATA has the same bit rate as the information MPR_DATA.

As described above, the bit output control unit 3462 directly outputs the information MPR_DATA as the rate-controlled information RATE_MPR_DATA without reducing the bit rate thereof. Hence, the rate-controlled information RATE_MPR_DATA output from the bit output control unit 3462 has the same bit rate as the information MPR_DATA. This means that the rate-controlled information RATE_MPR_DATA output from the register unit 342 of the semiconductor memory device in accordance with the embodiment has the same bit rate as the information MPR_DATA output from the MPR of the conventional semiconductor memory device. Accordingly, the register unit 342 of the semiconductor memory device in accordance with the embodiment does not change the bit rate of the information MPR_DATA in the information output mode MPR_MODE.

When the test mode entry signal TEST MPR MODE is activated, the test mode TEST_MPR_MODE is started. In the test mode TEST_MPR_MODE, the multiplexers MUX0, MUX1, MUX2, MUX3, MUX4, MUX5, MUX6 and MUX7 of the bit output control unit 3462 selectively output either the upper bits MPR_DATA<0>, MPR_DATA<1>, MPR_DATA<2> and MPR_DATA<3> which are received through the second input terminals IN2 or the lower bits MPR_DATA<4>, MPR_DATA<5>, MPR_DATA<6> and MPR_DATA<7> received through the third input terminals IN3 according to the output signal LSBEN of the operation control unit 3463 received through the second control input terminals CONT_IN2. In this case, the data applied to the first input terminals IN1 are not output and are ignored.

In the test mode TEST_MPR_MODE, the logic level of the output signal LSBEN of the operation control unit 3463 is transited in synchronization with the command signal MPR_RD for outputting the information in the MPR 340. Accordingly, at the timing of the activation of the command signal MPR_RD, the bit output control unit 3462 outputs the upper bits MPR_DATA<0>, MPR_DATA<1>, MPR_DATA<2> and MPR_DATA<3>, two of each at a time. In addition, at the timing of the deactivation of the command signal MPR_RD, the bit output control unit 3462 outputs the lower bits MPR_DATA<4>, MPR_DATA<5>, MPR_DATA<6> and MPR_DATA<7>, two of each at a time.

For example, let's assume that the information MPR_DATA output from the information selection unit 344 are '0 0 1 0 1 1 1 0'. Then, the bit output control unit 3462 outputs the rate-controlled information RATE_MPR_DATA of '0 0 0 0 1 1 0 0' at the timing of the activation of the command signal MPR_RD. Also, the bit output control unit 3462 outputs the rate-controlled information RATE_MPR_DATA of '1 1 1 1 1 1 0 0' at the timing of the deactivation of the command signal MPR_RD for outputting the information in the MPR 340.

As described above, the bit output control unit 3462 outputs the information MPR_DATA, two of each at a time, as the rate-controlled information RATE_MPR_DATA. Hence, the rate-controlled information RATE_MPR_DATA output from the bit output control unit 3462 has half the bit rate of the information MPR_DATA output from the information selection unit 344. This means that the rate-controlled information RATE_MPR_DATA output from the register unit 342 of the semiconductor memory device in accordance with the embodiment has half the bit rate of the information MPR_DATA output from the MPR of the conventional semiconductor memory device. Accordingly, the register unit 342 of the semiconductor memory device in accordance with the embodiment reduces the bit rate of the information MPR_DATA in the test mode TEST_MPR_MODE.

For reference, though not shown in FIG. 4, in order that the information in the register unit 342 is output from the semiconductor memory device, the command signal MPR_RD for outputting the information in the MPR 340 should be toggled.

That is, the information in the register unit 342 is output from the semiconductor memory device in response to the command signal MPR_CD. The command signal MPR_RD is synchronized with the external clock CLK Accordingly, in a case where the semiconductor memory device operates in the DDR mode, i.e., two bits of data are output in one cycle of the external clock CLK, each bit of the rate-controlled information RATE_MPR_DATA is output from the semiconductor memory device in response to both a rising edge and a falling edge of the toggling external clock CLK during an activation period of the command signal MPR_RD.

In the information output mode MPR_MODE, the information MPR_DATA received from the information selection unit 344 is directly output from the MPR 340 as the rate-controlled information RATE_MPR_DATA. Therefore, the bit rate of the rate-controlled information RATE_MPR_DATA is double data rate (DDR).

However, in the teat mode TEST_MPR_MODE, the information MPR_DATA received from the information selection unit 344 is output twice from the MPR 340 as the rate-controlled information RATE_MPR_DATA. Accordingly, the bit rate of the rate-controlled information RATE_MPR_DATA output from the MPR 340 is single data rate (SDR).

In summary, the MPR 340 of the semiconductor memory device in accordance with the embodiment includes the bit rate control unit 346, which is different from the MPR 140 in FIG. 1. As such, the MPR 340 can reduce the bit rate of the information output from the MPR 340.

Figure 5:
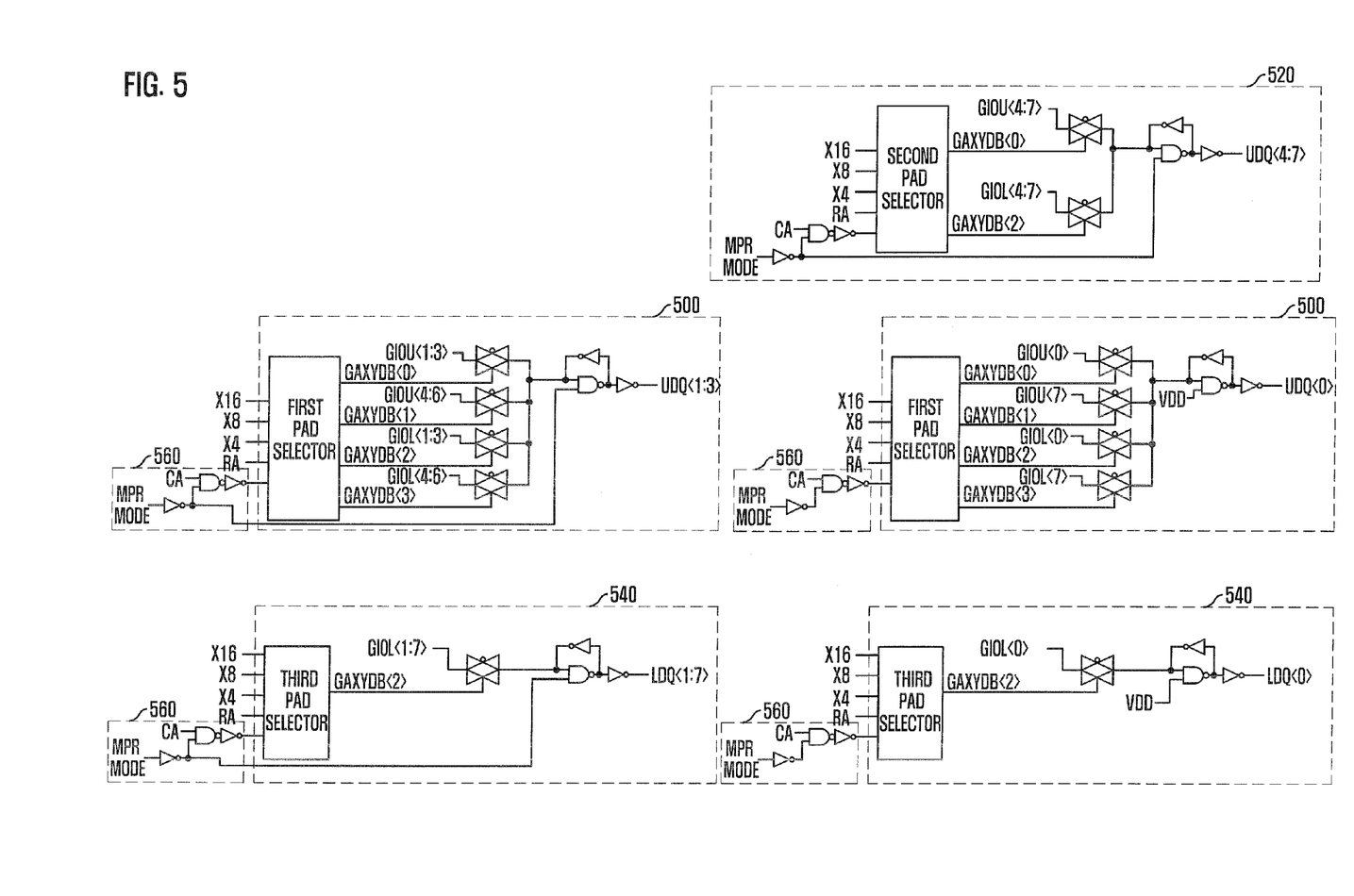
FIG. 5 is a block diagram for illustrating a path for transferring information in a multi-purpose register when connection relations of the global lines and data output pads are varied according to variations of a data output bandwidth, in a semiconductor memory device in accordance with an embodiment of the present invention.

FIG. 5 is a block diagram for illustrating a path for transferring the information in the MPR when connection relations of the global lines and the data output pads are varied according to the variations of the data output bandwidth, in the semiconductor memory device in accordance with an embodiment of the present invention.

Referring to FIG. 5, as the data output bandwidth is varied to ×16, ×8 and ×4, the connection relations of the global lines GIOU<0:7> and GIOL<0:7> and the data output pads UDQ<0:7> and LDQ<0:7> in the semiconductor memory device are varied. Simple connection relations are not shown in FIG. 5 because they are already shown in FIG. 2.

Specifically, when the data output bandwidth of the semiconductor memory device is ×16, the global lines GIOU<0:7> and GIOL<0:7> are one-to-one connected to the data output pads UDQ<0:7> and LDQ<0:7>.

In more detail, the zeroth upper global line GIOU<0> is connected to the zeroth upper data output pad UDQ<0>. The first upper global line GIOU<1> is connected to the first upper data output pad UDQ<1>. The second upper global line GIOU<2> is connected to the second upper data output pad UDQ<2>. The third upper global line GIOU<3> is connected to the third upper data output pad UDQ<3>. The fourth upper global line GIOU<4> is connected to the fourth upper data output pad UDQ<4>. The fifth upper global line GIOU<5> is connected to the fifth upper data output pad UDQ<5>. The sixth upper global line GIOU<6> is connected to the sixth upper data output pad UDQ<6>. The seventh upper global line GIOU<7> is connected to the seventh upper data output pad UDQ<7>. Similarly, the zeroth lower global line GIOL<0> is connected to the zeroth lower data output pad LDQ<0>. The first lower global line GIOL<1> is connected to the first lower data output pad LDQ<1>. The second lower global line GIOL<2> is connected to the second lower data output pad LDQ<2>. The third lower global line GIOL<3> is connected to the third lower data output pad LDQ<3>. The fourth lower global line GIOL<4> is connected to the fourth lower data output pad LDQ<4>. The fifth lower global line GIOL<5> is connected to the fifth lower data output pad LDQ<5>. The sixth lower global line GIOL<6> is connected to the sixth lower data output pad LDQ<6>. The seventh lower global line GIOL<7> is connected to the seventh lower data output pad LDQ<7>.

In this case, in the normal mode NORMAL_MODE, data in banks BANK0, BANK1, BANK2, BANK3, BANK4, BANK5, BANK6 and BANK7 are loaded on all of the global lines GIOU<0:7> and GIOL<0:7> and the global lines GIOU<0:7> and GIOL<0:7> are directly connected to the data output pads UDQ<0:7> and LDQ<0:7>, respectively. Therefore, the data in the banks BANK0, BANK1, BANK2, BANK3, BANK4, BANK5, BANK6 and BANK7 are output through the respective data output pads UDQ<0:7> and LDQ<0:7>.

To this end, a first pad selector 500, a second pad selector 520 and a third pad selector 540 are all enabled. Here, the first pad selector 500 is configured to control connections of all of the global lines GIOU<0:3>, GIOU<4:7>, GIOL<0:3> and GIOL<4:7> to the top upper data output pads UDQ<0:3> according to the data output bandwidth. The second pad selector 520 is configured to control connections of the bottom upper global lines GIOU<4:7> and the bottom lower global lines GIOL<4:7> to the bottom upper data output pads UDQ<4:7> according to the data output bandwidth. The third pad selector 540 is configured to control the connections of the lower global lines GIOL<0:7> to the lower data output pads LDQ<0:7> according to the data output bandwidth.

The global lines GIOU<0:7> and GIOL<0:7> are directly connected to the data output pads UDQ<0:7> and LDQ<0:7>, respectively, as described above. However, the information in the MPR 340 used in the information output mode MPR_MODE are loaded only on the zeroth upper global line GIOU<0> and the zeroth lower global line GIOL<0>. Therefore, the information in the MPR 340 are output only through the zeroth upper data output pad UDQ<0> and the zeroth lower data output pad LDQ<0>.

The data loaded on the global lines GIOU<1:7> and GIOL<1:7> other than the predetermined global lines GIOU<0> and GIOL<0> are not output through the data output pads UDQ<1:7> and LDQ<1:7>. This is because the semiconductor memory device includes an output data selector 560. The output data selector 560 selects data to be output through the pads UDQ<0:7> and LDQ<0:7> selected by the pad selectors 500, 520 and 540, according to an operation mode such as a normal mode NORMAL_MODE and an information output mode MPR_MODE.

In the normal mode NORMAL_MODE, the output data selector 560 allows the data loaded on all of the global lines GIOU<0:7> and GIOL<0:7> to be transferred to the pads UDQ<0:7> and LDQ<0:7> selected by the pad selector 500, 520 and 540. However, in the information output mode MPR_MODE, the output data selector 560 transfers the data loaded on the predetermined global lines GIOU<0> and GIOL<0> to the predetermined data output pads UDQ<0> and LDQ<0>, and applies a ground voltage to the other data output pads UDQ<1:7> and LDQ<1:7>.

Therefore, in the information output mode MPR_MODE, unnecessary data may not be output.

When the data output bandwidth of the semiconductor memory device is ×8, the global lines GIOU<0:7> and GIOL<0:7> are connected to the upper data output pads UDQ<0:7> in two-to-one correspondence.

In other words, the zeroth to seventh lower data output pads LDQ<0:7> are not used. Hence, the zeroth upper global line GIOU<0> and the zeroth lower global line GIOL<0> are connected to the zeroth upper data output pad UDQ<0>. The first upper global line GIOU<1> and the first lower global line GIOL<1> are connected to the first upper data output pad UDQ<1>. The second upper global line GIOU<2> and the second lower global line GIOL<2> are connected to the second upper data output pad UDQ<2>. The third upper global line GIOU<3> and the third lower global line GIOL<3> are connected to the third upper data output pad UDQ<3>. The fourth upper global line GIOU<4> and the fourth lower global line GIOL<4> are connected to the fourth upper data output pad UDQ<4>. The fifth upper global line GIOU<5> and the fifth lower global line GIOL<5> are connected to the fifth upper data output pad UDQ<5>. The sixth upper global line GIOU<6> and the sixth lower global line GIOL<6> are connected to the sixth upper data output pad UDQ<6>. Finally, the seventh upper global line GIOU<7> and the seventh lower global line GIOL<7> are connected to the seventh upper data output pad UDQ<7>.

In this case, in the normal mode NORMAL_MODE, the data in the banks BANK1, BANK2, BANK3, BANK4, BANK5, BANK6 and BANK7 are loaded on all of the global lines including the upper global lines GIOU<0:7> and the lower global lines GIOL<0:7>, as described above. The global lines GIOU<0:7> and GIOL<0:7> are divided to the upper global lines GIOU<0:7> and the lower global lines GIOL<0:7>, and not only the upper global lines GIOU<0:7>, but also the lower global lines GIOL<0:7> are connected to the upper data output pads UDQ<0:7>. Therefore, the data in the banks BANK1, BANK2, BANK3, BANK4, BANK5, BANK6 and BANK7 are output through the upper data output pads UDQ<0:7>.

To this end, the first pad selector 500 is enabled, which is configured to control the connections of all of the global lines GIOU<0:3>, GIOU<4:7>, GIOL<0:3> and GIOL<4:7> to the top upper data output pads UDQ<0:3> according to the data output bandwidth. Also, the second pad selector 520 is enabled, which is configured to control the connections of the bottom upper global lines GIOU<4:7> and the bottom lower global lines GIOL<4:7> to the bottom upper data output pads UDQ<4:7> according to the data output bandwidth. However, the third pad selector 240 is disabled, which is configured to control the connections of the lower global lines GIOL<0:7> to the lower data output pads LDQ<0:7> according to the data output bandwidth.

As described above, the global lines GIOU<0:7> and GIOL<0:7> are divided to the upper global lines GIOU<0:7> and the lower global lines GIOL<0:7>, and not only the upper global lines GIOU<0:7>, but also the lower global lines GIOL<0:7> are connected to the upper data output pads UDQ<0:7>. However, the information in the MPR 340, which are used in the information output mode, are loaded only on the zeroth upper global line GIOU<0> and the zeroth lower global line GIOL<0>. Therefore, the information in the MPR 340 are output only through the zeroth upper data output pad UDQ<0>.

In order to determine whether the data output through the zeroth upper data output pad UDQ<0> is the data loaded on the zeroth upper global line GIOU<0> or the data loaded on the zeroth lower global line GIOL<0>, a not-used bit of the row address (RA) is utilized.

The data loaded on the global lines GIOU<1:7> and GIOL<1:7> other than the predetermined global lines GIOU<0> and GIOL<0> are not output through the data output pads UDQ<1:7>. This is because the semiconductor memory device includes the output data selector 560 configured to select data to be output through the pads UDQ<0:7> selected by the pad selectors 500, 520 and 540, according to the operation mode such as the normal mode NORMAL_MODE and the information output mode MPR_MODE.

In the normal mode NORMAL_MODE, the output data selector 560 allows the data loaded on all of the global lines GIOU<0:7> and GIOL<0:7> to be transferred to the pads UDQ<0:7> selected by the pad selector 500, 520 and 540. However, in the information output mode MPR_MODE, the output data selector 560 allows the data loaded on the predetermined global lines GIOU<0> and GIOL<0> to be transferred to the predetermined data output pads UDQ<0>, and applies a ground voltage to the other data output pads UDQ<1:7>.

Therefore, in the information output mode MPR_MODE, unnecessary data may not be output.

When the data output bandwidth of the semiconductor memory device is ×4, the global lines GIOU<0:7> and GIOL<0:7> are connected to the zeroth to third upper data output pads UDQ<0:3> in four-to-one correspondence.

In other words, the fourth to seventh upper data output pads UDQ<4:7> and the zeroth to seventh lower data output pads LDQ<0:7> are not used. Hence, the zeroth and seventh upper global lines GIOU<0> and GIOU<7> and the zeroth and seventh lower global lines GIOL<0> and GIOL<7> are connected to the zeroth upper data output pad UDQ<0>. The first and sixth upper global lines GIOU<1> and GIOU<6> and the first and sixth lower global lines GIOL<1> and GIOL<6> are connected to the first upper data output pad UDQ<1>. The second and fifth upper global lines GIOU<2> and GIOU<5> and the second and fifth lower global lines GIOL<2> and GIOL<5> are connected to the second upper data output pad UDQ<2>. The third and fourth upper global lines GIOU<3> and GIOU<4> and the third and fourth lower global lines GIOL<3> and GIOL<4> are connected to the third upper data output pad UDQ<3>.

In this case, only the top upper data output pads UDQ<0:3> are used, and the bottom upper data output pads UDQ<4:7>, the top lower data output pads LDQ<0:3> and the bottom lower data output pads LDQ<4:7> are not used. Thus, in the normal mode NORMAL_MODE, the data in the banks BANK1, BANK2, BANK3, BANK4, BANK5, BANK6 and BANK7 are loaded on all of the global lines GIOU<0:7> and GIOL<0:7>. The global lines GIOU<0:7> and GIOL<0:7> are divided to the top upper global lines GIOU<0:3>, bottom upper global lines GIOU<4:7>, top lower global lines GIOL<0:3> and bottom lower global lines GIOL<4:7>. Here, not only the top upper global lines GIOU<0:3>, but also the bottom upper global lines GIOU<4:7>, the top lower global lines GIOL<0:3> and the bottom lower global lines GIOL<4:7> are connected to the top upper data output pads UDQ<0:3>. Therefore, the data in the banks BANK1, BANK2, BANK3, BANK4, BANK5, BANK6 and BANK7 are output through the top upper data output pads UDQ<0:3>.

To this end, the first pad selector 500 is enabled, which is configured to control the connections of all of the global lines GIOU<0:3>, GIOU<4:7>, GIOL<0:3> and GIOL<4:7> to the top upper data output pads UDQ<0:3> according to the data output bandwidth. However, the second pad selector 520 is disabled, which is configured to control the connections of the bottom upper global lines GIOU<4:7> and the bottom lower global lines GIOL<4:7> to the bottom upper data output pads UDQ<4:7> according to the data output bandwidth. In addition, the third pad selector 540 is also disabled, which is configured to control the connections of the lower global lines GIOL<0:7> to the lower data output pads LDQ<0:7> according to the data output bandwidth.

As described above, the global lines GIOU<0:7> and GIOL<0:7> are divided to the top upper global lines GIOU<0:3>, the bottom upper global lines GIOU<4:7>, the top lower global lines GIOL<0:3> and the bottom lower global lines GIOL<4:7>. Here, not only the top upper global lines GIOU<0:3>, but also the bottom upper global lines GIOU<4:7>, the top lower global lines GIOL<0:3> and the bottom lower global lines GIOL<4:7> are connected to the top upper data output pads UDQ<0:3>. However, the information in the MPR 340, which are used in the information output mode MPR_MODE, are loaded only on the zeroth upper global line GIOU<0> and the zeroth lower global line GIOL<0>. Therefore, the information in the MPR 340 are output only through the zeroth upper data output pad UDQ<0>.

In order to determine whether the data output through the top upper data output pads UDQ<0:3> are the data loaded on the upper global lines GIOU<0:7> or the data loaded on the lower global lines GIOL<0:7>, a not-used bit of the row address (RA) is utilized. Furthermore, in order to determine whether the data output through the top upper data output pads UDQ<0:3> are the data loaded on the top global lines GIOU<0:3> and GIOL<0:3> or the data loaded on the bottom global lines GIOU<4:7> and GIOL<4:7>, a not-used bit of the column address (CA) is utilized.

The data loaded on the global lines GIOU<1:7> and GIOL<1:7> other than the predetermined global lines GIOU<0> and GIOL<0> are not output through the data output pads UDQ<1:3>. This is because the semiconductor memory device includes the output data selector 560 configured to select data to be output through the pads UDQ<0:3> selected by the pad selectors 500, 520 and 540, according to the operation mode such as the normal mode NORMAL_MODE and the information output mode MPR_MODE.

In the normal mode NORMAL_MODE, the output data selector 560 allows the data loaded on all of the global lines GIOU<0:7> and GIOL<0:7> to be transferred to the pads UDQ<0:3> selected by the pad selector 500, 520 and 540. However, in the information output mode MPR_MODE, the output data selector 560 allows the data loaded on the predetermined global lines GIOU<0> and GIOL<0> to be transferred to the predetermined data output pads UDQ<0>, and applies a ground voltage to the other data output pads UDQ<1:3>.

Therefore, in the information output mode MPR_MODE, unnecessary data may not be output.

As described above, the semiconductor memory device in accordance with the embodiments of the present invention can control the bit rate of the information output from the MPR in the semiconductor memory device according to the test mode. That is, the semiconductor memory device reduces the bit rate of the information output from the MPR in the test mode TEST_MPR_MODE, and maintains the bit rate of the information in the information output mode MPR_MODE. As such, the semiconductor memory device can be accurately tested in the test mode even if the operating speeds of the semiconductor memory device and the test equipment are different from each other, and can be operated normally in the normal mode and the information output mode.

As a result, it is possible to reduce additional cost and time caused by the test errors during the manufacturing of the semiconductor memory device.

In addition, the semiconductor memory device outputs the information in the MPR through the predetermined data output pads, and the signal having the predetermined logic level through the data output pads other than the predetermined data output pads. As such, the semiconductor memory device can reduce the unnecessary current consumption.

While the present invention has been described with respect to the specific embodiments, it will be apparent to those skilled in the art that various changes and modifications may be made without departing from the spirit and scope of the invention as defined in the following claims.

For example, the case where the bit rate is reduced from the double data rate (DDR) to the single data rate (SDR) is described above. However, the present invention is not limited thereto. The bit rate may also be reduced from any bit rate higher than the double data rate (DDR).

In addition, the positions and kinds of the logic gates and transistors described in the embodiments may be changed according to the polarity of the input signals.

What is claimed is:

1. A semiconductor memory device, comprising:
a multi-purpose register configured to separately store a plurality of information, and control a bit rate of the stored information in a test mode, each of the information having multiple bits; and
a connection selector configured to selectively connect an output terminal of the multi-purpose register to a plurality of global lines, according to an operation mode.

2. The semiconductor memory device as recited in claim 1, further comprising:
a plurality of banks;
a plurality of data output pads;
a pad selector configured to select the data output pad for outputting data according to a data output bandwidth; and
an output data selector configured to select the data to be output through the selected data output pad according to the operation mode.

3. The semiconductor memory device as recited in claim 2, wherein the connection selector selectively connects an output terminal of one of the banks to the plurality of global lines according to an operation mode.

4. The semiconductor memory device as recited in claim 3, wherein the connection selector connects the output terminal of the one bank to the plurality of global lines, in a normal mode.

5. The semiconductor memory device as recited in claim 4, wherein the output data selector outputs the data loaded on the plurality of global lines, in a predetermined pattern, through the data output pads selected by the pad selector, in the normal mode.

6. The semiconductor memory device as recited in claim 2, wherein the connection selector connects the output terminal of the multi-purpose register to a predetermined global line among the plurality of global lines, in an information output mode.

7. The semiconductor memory device as recited in claim 6, wherein the output data selector outputs the data loaded on the predetermined global line through a predetermined data output pad among the data output pads selected by the pad selector, in the information output mode.

8. The semiconductor memory device as recited in claim 7, wherein the output data selector outputs a signal of a predetermined logic level through the data output pads other than the predetermined data output pad among the data output pads selected by the pad selector in the information output mode.

9. The semiconductor memory device as recited in claim 1, wherein the multi-purpose register includes:
   a plurality of register units configured to store the plurality of information, respectively;
   an information selection unit configured selectively to output the information stored in one of the register units; and
   a bit rate control unit configured in the test mode to reduce the bit rate of the information received from the information selection unit, and directly to output the information output from the information selection unit without reducing the bit rate thereof, in the information output mode.

10. The semiconductor memory device as recited in claim 9, wherein the bit rate control unit includes:
    a bit output control unit configured continuously to output each bit of the information received from the information selection unit a predetermined number of times in the test mode, and to output each bit of the information received from the information selection unit as received, in the information output mode; and
    an operation control unit configured to control the bit output control unit in the test mode.

11. The semiconductor memory device as recited in claim 10, wherein the bit output control unit includes one or more multiplexers, the number of the multiplexers being identical to the bit number of the information output from the information selection unit, and each multiplexer outputs data received through a first input terminal in the information output mode, and selectively outputs data received through a second input terminal or data received through a third input terminal, according to an output signal of the operation control unit in the test mode.

12. The semiconductor memory device as recited in claim 9, wherein the information selection unit is operated in response to selection information defined in a memory register set (MRS).

13. The semiconductor memory device as recited in claim 1, wherein the plurality of information includes information indicating an internal temperature received from an on die thermal sensor (ODTS).

14. The semiconductor memory device as recited in claim 1, wherein the plurality of information includes information set to a predefined value.

* * * * *